(12) United States Patent
Takemori

(10) Patent No.: US 7,184,453 B2
(45) Date of Patent: Feb. 27, 2007

(54) SEMICONDUCTOR LASER DEVICE CONTAINING LASER DRIVER AND ELECTRONIC EQUIPMENT HAVING THE SAME

(75) Inventor: Hirotoshi Takemori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 197 days.

(21) Appl. No.: 10/678,181

(22) Filed: Oct. 6, 2003

(65) Prior Publication Data

US 2004/0071174 A1   Apr. 15, 2004

(30) Foreign Application Priority Data

Oct. 4, 2002   (JP) .............................. 2002-292644

(51) Int. Cl.
*H01S 5/00* (2006.01)
(52) U.S. Cl. ................................ 372/50.21; 372/50.23
(58) Field of Classification Search ................ 327/43; 372/50.21
See application file for complete search history.

(56) References Cited

U.S. PATENT DOCUMENTS 5,490,158 A * 2/1996 Mogi ........................... 372/36
5,544,268 A * 8/1996 Bischel et al. ................. 385/4
5,727,009 A * 3/1998 Tajiri et al. ............... 372/50.11

FOREIGN PATENT DOCUMENTS

| CN | 1204171 A | 1/1999 |
|---|---|---|
| JP | 6-203403 | 7/1994 |
| JP | 08-96393 A | 4/1996 |
| JP | 11-025465 | 1/1999 |
| JP | 2001-111159 A | 4/2001 |
| JP | 2001-256661 A | 9/2001 |
| JP | 2002-184013 A | 6/2002 |
| JP | 2002-270942 | 9/2002 |

OTHER PUBLICATIONS

Chinese Office Action dated Mar. 18, 2005.

* cited by examiner

*Primary Examiner*—Armando Rodriguez
(74) *Attorney, Agent, or Firm*—Morrison & Foerster LLP

(57) ABSTRACT

There is provided a semiconductor laser device containing a laser driver capable of implementing downsizing, thinning and cost reduction of equipment using the laser device. In the semiconductor laser device containing a laser driver, a semiconductor laser element, a laser driver for driving the laser element, and a signal detection part for performing photoelectric conversion are mounted on a common mount surface of a lead frame and moreover accommodated in a common package. Upward of the semiconductor laser element is provided a hologram element for transmitting laser light emitted by the laser element toward a recording medium and then diffracting toward the signal detection part the laser light reflected by the recording medium. The laser driver and the signal detection part are disposed on both sides with respect to an optical axis of the laser element.

12 Claims, 11 Drawing Sheets

SEMICONDUCTOR LASER DEVICE CONTAINING LASER DRIVER AND ELECTRONIC EQUIPMENT HAVING THE SAME

BACKGROUND OF THE INVENTION

The present invention relates to a semiconductor laser device containing a laser driver. More particularly, the invention relates to a semiconductor laser device in which a semiconductor laser element as well as a laser driver for driving the laser element are mounted on a lead frame.

Also, the present invention relates to electronic equipment having such a semiconductor laser device containing a laser driver.

Conventionally, there has been known a semiconductor laser device as shown in FIGS. 9A and 9B (see FIG. 4 of Japanese Patent Laid-Open Publication HEI 6-203403). This semiconductor laser device is fabricated through the steps of forming a resin package 112 with a resin mold so that a mount portion 160 of a lead frame 106 is surrounded by the resin package 112, die-bonding on the mount portion a planar submount 105 on which a mirror (not shown) and a semiconductor laser element 101 are mounted, further die-bonding on a submount 161 therebeside a signal detection part 103, connecting (wire-bonding) electrodes of the semiconductor laser element 101, the signal detection part 103 or the like and lead pins 113 with each other by means of thin metallic wires 114, performing burn-in and characteristic inspections, and thereafter fitting a hologram element 104 by UV resin (ultraviolet curable resin) 109 in such a manner that the upper opening of the resin package 112 is covered therewith. Further, in the submount 105, a monitor detection part (not shown) for monitoring an optical output of the semiconductor laser element 101 is integrally formed. Laser light 115 emitted by the semiconductor laser element 101 is reflected by the mirror to come incident on the hologram element 104, and is then transmitted by the hologram element 104 to be applied to and reflected by an unshown optical disc (on which various informations have been recorded), thus returning as signal light 116 representing information recorded on the optical disc. This signal light 116 is diffracted by the hologram element 104, led to the signal detection part 103, converted there into an electric signal by the signal detection part 103, and then taken out via the lead pins 113.

However, in the conventional semiconductor laser device, the laser driver for driving the semiconductor laser element 101 is still provided as an external part.

As a result of this, there has been a problem that downsizing, thinning and cost reduction of equipment using the laser device cannot be implemented sufficiently. In other words, since the laser device and the laser driver are generally used in combination, downsizing of the laser device alone, even if accomplished, could not produce so much effect.

SUMMARY OF THE INVENTION

Accordingly, an object of the present invention is to provide a semiconductor laser device containing a laser driver capable of implementing further downsizing, thinning and cost reduction of equipment using the laser device.

Another object of the present invention is to provide electronic equipment having such a semiconductor laser device containing a laser driver.

In order to achieve the above objects, according to the present invention, there is provided a semiconductor laser device containing a laser driver, comprising:

a semiconductor laser element;

a laser driver for driving the semiconductor laser element;

a lead frame having a common mount surface on which the semiconductor laser element and the laser driver are mounted; and one common package for accommodating therein the semiconductor laser element and the laser driver.

In the semiconductor laser device containing a laser driver of the invention, since the semiconductor laser element and the laser driver for driving the semiconductor laser element are mounted on the common mount surface of the lead frame and moreover accommodated in the common package, it becomes possible to implement further downsizing, thinning and cost reduction of the semiconductor laser device containing a laser driver, and therefore to implement further downsizing, thinning and cost reduction of equipment using the laser device as well.

In one embodiment, the semiconductor laser device further comprises:

a signal detection part for performing photoelectric conversion, wherein the signal detection part is mounted on the common mount surface of the lead frame and moreover accommodated in the common package; and a hologram element provided upward of the semiconductor laser element and serving for transmitting laser light emitted by the semiconductor laser element toward a recording medium and then diffracting toward the signal detection part the laser light reflected by the recording medium.

In this embodiment, since the semiconductor laser element, the laser driver for driving the semiconductor laser element and the signal detection part for performing photoelectric conversion are mounted on the common mount surface of the lead frame and moreover accommodated in the common package, it becomes possible to implement further downsizing, thinning and cost reduction of equipment using this semiconductor laser device containing a laser driver.

In addition, in this semiconductor laser device containing a laser driver, the operation of extracting a signal is performed in the same manner as in the prior art. That is, laser light emitted by the semiconductor laser element is transmitted by the hologram element so as to be applied to and reflected by a recording medium, and returns as signal light representing information recorded on the recording medium. This signal light is diffracted by the hologram element, led to the signal detection part, and converted into an electric signal by the signal detection part, thus being taken out.

Also, in one embodiment, the laser driver and the signal detection part are disposed on both sides with respect to an optical axis of the semiconductor laser element.

In this embodiment, the laser driver and the signal detection part are disposed on both sides with respect to an optical axis of the semiconductor laser element on the common mount surface. That is, the laser driver and the signal detection part are placed farthest on the common mount surface. Consequently, influences of heat generation of the laser driver exerted on the signal detection part can be reduced to the least.

Also, in one embodiment, the laser driver and the signal detection part are disposed on both sides of the semiconductor laser element in such a direction that laser light emitted by the semiconductor laser element results in a narrower breadth.

In this embodiment, since the laser driver and the signal detection part are disposed on both sides of the semiconductor laser element in such a direction that laser light emitted by the semiconductor laser element results in a narrower breadth, outgoing light of the semiconductor laser element less influences the signal detection part and the laser driver. As a result of this, the signal detection part is less subject to influences of stray light or the like. Further, bare chips may be used as the laser driver.

In addition, in this semiconductor laser device containing a laser driver, the operation of extracting a signal is performed in the same manner as in the prior art.

Also, in one embodiment, the laser driver and the monitor detection part are integrated as a submount member having a planar outer configuration, and the submount member is disposed vertical to an optical axis of the semiconductor laser element.

In this embodiment, the laser driver and the monitor detection part are integrated as a submount member having a planar outer configuration. Therefore, the laser driver and the monitor detection part are treated as one component part, allowing the parts count to be substantially reduced. Further, since this submount member is disposed vertical to the optical axis of the laser element, the submount member can be die-bonded onto the common mount surface simultaneously and together with the laser element during the manufacturing assembly, thus allowing the working man-hours to be reduced. As a result of this, it becomes possible to implement further downsizing, thinning and cost reduction of this semiconductor laser device containing a laser driver, and therefore to implement further downsizing, thinning and cost reduction of equipment using the laser device as well.

In addition, in this semiconductor laser device containing a laser driver, the operation of extracting a signal is performed in the same manner as in the prior art. Besides, since the laser driver drives the semiconductor laser element based on the output of the monitor detection part, the optical output of the semiconductor laser element can be controlled stably.

Also, in one embodiment, the semiconductor laser element is disposed so as to emit laser light parallel to the common mount surface, and a mirror for reflecting the emitted laser light so as to raise the laser light vertical to the common mount surface is mounted on the common mount surface.

In this embodiment, the laser element is disposed so as to emit laser light parallel to the common mount surface, and the mirror for reflecting the emitted laser light so as to raise the laser light vertical to the common mount surface is mounted on the common mount surface. As a result of this, it becomes easier to achieve the bonding of individual component parts in their mounting onto the common mount surface, thus making it easier to achieve the manufacturing assembly.

Also, in one embodiment, a heat-radiating lead is connected to the laser driver.

In this embodiment, since the heat-radiating lead is connected to the laser driver, heat generated by the laser driver is radiated outside through the heat-radiating lead. Therefore, influences of heat generation of the laser driver exerted on the other component parts can be reduced.

Also, one embodiment further comprises lead pins extending in one direction within a plane along the common mount surface, wherein a direction along which the laser driver, the semiconductor laser element and the signal detection part are arrayed and a direction along which the lead pins extend are coincident with each other.

In this embodiment, the direction along which the laser driver, the semiconductor laser element and the signal detection part are arrayed and the direction along which the lead pins extend are coincident with each other. Therefore, in this semiconductor laser device containing a laser driver, there is no need for disposing component parts along a direction vertical to the direction along which the lead pins extend, so that the size in the direction vertical to the direction along which the lead pins extend can be reduced. Accordingly, it becomes possible to implement further thinning of equipment using the laser device.

Also, one embodiment further comprises lead pins extending in one direction within a plane along the common mount surface, wherein a direction along which the laser driver, the semiconductor laser element and the signal detection part are arrayed and a direction along which the lead pins extend are vertical to each other.

In this embodiment, the direction along which the laser driver, the semiconductor laser element and the signal detection part are arrayed and the direction along which the lead pins extend are vertical to each other. Therefore, this laser device containing a laser driver can be reduced in the size in the direction along which the lead pins extend (i.e., in the longitudinal direction). Consequently, it becomes possible to forward the downsizing of equipment using the laser device.

Also, one embodiment further comprises a monitor detection part for monitoring an optical output of the semiconductor laser element, wherein the laser driver drives the semiconductor laser element based on an output of the monitor detection part, the monitor detection part is mounted on the common mount surface of the lead frame and moreover accommodated in the common package, and wherein the laser driver and the monitor detection part are integrated as a submount member having a planar outer configuration.

In this embodiment, the semiconductor laser element, the monitor detection part for monitoring an optical output of the semiconductor laser element, and the laser driver for driving the semiconductor laser element based on an output of the monitor detection part are mounted on the common mount surface of the lead frame and moreover accommodated in the common package. Therefore, it becomes possible to implement further downsizing, thinning and cost reduction of equipment using the laser device. Still, the laser driver and the monitor detection part are integrated as a submount member having a planar outer configuration. Therefore, the laser driver and the monitor detection part are treated as one component part, allowing the parts count to be substantially reduced. As a result of this, it becomes possible to implement further downsizing, thinning and cost reduction of this semiconductor laser device containing a laser driver, and therefore to implement further downsizing, thinning and cost reduction of equipment using the laser device as well.

Also, in one embodiment, the laser driver integrated into the submount member is disposed along an optical-axis direction of the monitor detection part.

In this embodiment, since the laser driver integrated into the submount member is disposed along the optical-axis direction of the monitor detection part, there is no need for disposing component parts along a direction vertical to the optical-axis direction of the monitor detection part, so that the size in the direction vertical to the optical-axis direction of the monitor detection part is reduced. Accordingly, it becomes possible to implement further thinning of this semiconductor laser device containing a laser driver and therefore of equipment using the laser device as well.

Also, in one embodiment, an output-control use lead is connected to the laser driver.

In this embodiment, since the output-control use lead is connected to the laser driver, the output of the laser element is controlled via the laser driver in response to a control signal applied from outside to the output-control use lead. Accordingly, the circuit of the laser driver can be simplified, so that further cost reduction can be implemented.

In addition, it is desirable that the optical output of the semiconductor laser element is controlled according to the level of a voltage applied to the output-control leads. In this case, the circuit of the laser driver can be simplified, so that further cost reduction can be implemented.

Also, in one embodiment, the semiconductor laser element is disposed so as to emit laser light parallel to the common mount surface, and a mirror for reflecting the emitted laser light so as to raise the laser light vertical to the common mount surface is mounted on the common mount surface.

In this embodiment, the semiconductor laser element is disposed so as to emit laser light parallel to the common mount surface, and the mirror for reflecting the emitted laser light so as to raise the laser light vertical to the common mount surface is mounted on the common mount surface. As a result of this, it becomes easier to achieve the bonding of individual component parts in their mounting onto the common mount surface, thus making it easier to achieve the manufacturing assembly.

Electronic equipment according to the present invention has the laser device as defined above.

Since the electronic equipment of the invention has the above-described laser device, it becomes possible to implement further downsizing, thinning and cost reduction of the electronic equipment.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Hereinbelow, the present invention is described in detail by way of embodiments thereof illustrated in the accompanying drawings.

Figure 1A:
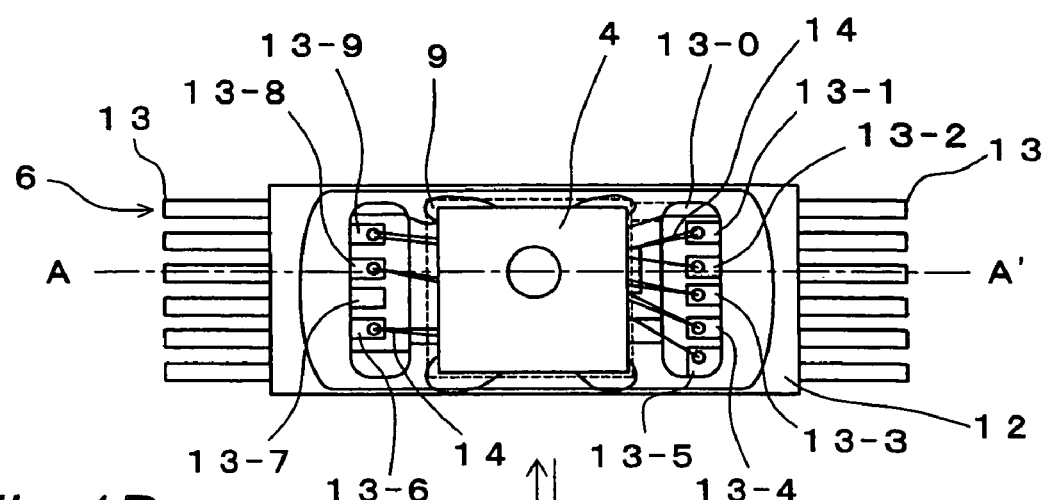
FIGS. 1A and 1B are a plan view and a sectional view, respectively, showing the construction of a semiconductor laser device containing a laser driver according to a first embodiment of the present invention.
Figure 1B:
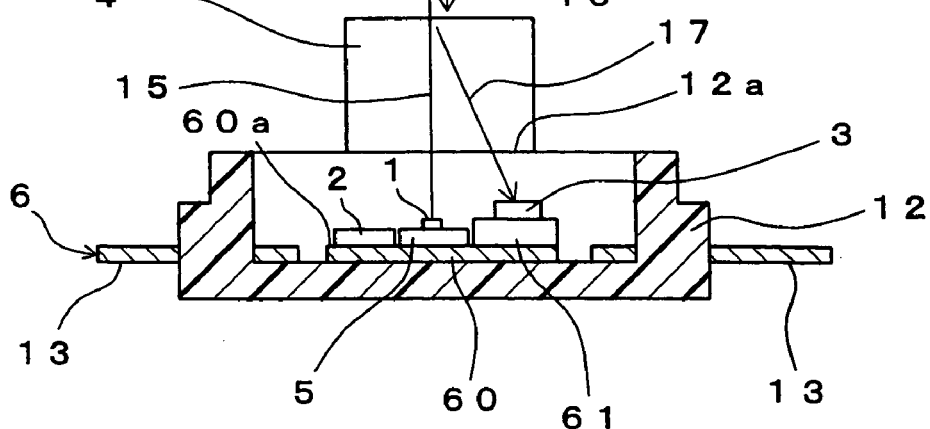

FIG. 1A shows the semiconductor laser device containing a laser driver according to the first embodiment of the invention as viewed from above, and FIG. 1B schematically shows an A–A' cross section in FIG. 1A.

This semiconductor laser device containing a laser driver is equipped with a lead frame 6, and a resin package 12 integrally formed with a resin mold so that a mount portion 60 of this lead frame 6 is surrounded by the resin package 12. The package 12 has an opening at its upper portion 12a.

The lead frame 6 includes a mount portion (also referred to as island or die-pad) 60 having a flat, rectangular mount surface 60a, and lead pins 13, 13, . . . extending from vicinities of the mount portion 60 toward both sides of the A–A' direction (rightward and leftward directions in FIG. 1) within a plane along the mount surface 60a. It is noted that reference numerals 13-0, 13-1, . . . , 13-9 denote inner lead portions present within the package 12 out of the lead pins 13, 13, . . . .

On the mount surface 60a are provided a semiconductor laser element 1, a laser driver 2 for driving the semiconductor laser element 1, and a signal detection part 3 for performing photoelectric conversion. The semiconductor laser element 1 and the signal detection part 3 are mounted on the mount surface 60a via planar submounts 5, 61, respectively, while the laser driver 2 is mounted directly on the mount surface 60a. Also, the laser driver 2 and the signal detection part 3 are disposed on both sides with respect to the optical axis of the semiconductor laser element 1 (i.e., at both-side positions of the optical axis on a plane containing the optical axis). In this embodiment, the laser driver 2, the semiconductor laser element 1 and the signal detection part 3 are arrayed in this order along the A–A' direction. These component parts 1, 2, 3, 5 and 61 are accommodated in the common package 12 together with the mount portion 60.

The semiconductor laser element 1 is disposed in such a direction that laser light is emitted vertically to the mount surface 60a (unless otherwise specified, this is similarly applicable also to later-described individual embodiments).

Upward of the semiconductor laser element 1, a hologram element 4 is mounted so as to cover the opening of the upper part 12a of the package 12. This hologram element 4 is a well-known one in which a diffraction grating is formed on one of up and lower sides while hologram is formed on the other side. By this hologram element 4, laser light 15 emitted by the semiconductor laser element 1 is transmitted as 0th-order light toward a recording medium (not shown) such as an optical disc, and the laser light (signal light) 16 reflected by this recording medium is diffracted as ±1st-order light toward the signal detection part 3.

This semiconductor laser device containing the laser driver is fabricated through the steps of forming the resin package 12 with a resin mold so that the mount portion 60 of the lead frame 6 is thereby surrounded, die-bonding on the mount surface 60a the laser driver 2, the submount 5 with the semiconductor laser element 1 mounted thereon as well as the submount 61 with the signal detection part 3 mounted thereon, connecting (wire-bonding) electrodes of the semiconductor laser element 1, the signal detection part 3 or the like and lead pins 13 (more specifically, inner leads 13-1, 13-2, ..., 13-6, 13-8, 13-9) with each other by means of thin metallic wires 14, performing burn-in and characteristic inspections, and thereafter fitting the hologram element 4 by UV resin (ultraviolet curable resin) 9 in such a manner that the upper opening of the resin package 12 is covered therewith.

Laser light 15 emitted by the semiconductor laser element 1 comes incident on the hologram element 4, and is then transmitted by the hologram element 4 so as to be applied to and reflected by an unshown optical disc as an example of the recording medium, thus returning as signal light 16 representing information recorded on the optical disc. This laser light 16 is diffracted by the hologram element 4, led to the signal detection part 3, converted into an electric signal by this signal detection part 3, and then taken out via the lead pins 13.

In this semiconductor laser device containing a laser driver, since the semiconductor laser element 1, the laser driver 2 and the signal detection part 3 are mounted on the common mount surface 60a of the lead frame 6 and moreover accommodated in the common resin package 12, it becomes possible to implement further downsizing, thinning and cost reduction of equipment using the laser device. Still, the laser driver 2 and the signal detection part 3 are placed on both sides with respect to the optical axis of the semiconductor laser element 1 (i.e., at both-side positions of an optical axis on a plane containing the optical axis) on the mount surface 60a. That is, the laser driver 2 and the signal detection part 3 are placed farthest on the mount surface 60a. Consequently, influences of heat generation of the laser driver 2 exerted on the signal detection part 3 can be reduced to the least.

Also, the direction along which the laser driver 2, the semiconductor laser element 1 and the signal detection part 3 are arrayed and the direction along which the lead pins 13 extend are coincident with each other, and no component parts are placed along a direction vertical to the direction along which the lead pins extend, i.e., a depth-and-nearness direction (direction vertical to the drawing sheet) in FIG. 1B. By virtue of this, the size in the depth-and-nearness direction can be reduced. Accordingly, the thinning of the equipment using the laser device become implementable. Further, since the semiconductor laser element 1 is located at the outer-dimensional center of the package 12, positional adjustment of the semiconductor laser element 1 can be achieved more easily.

Figure 10:
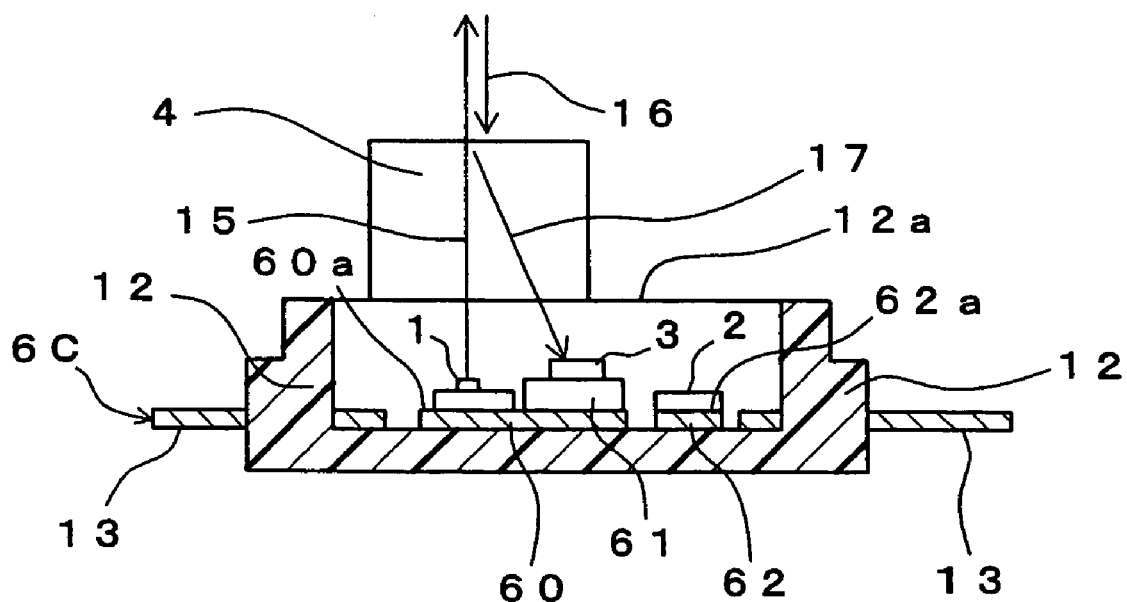
FIG. 10 is a view showing the construction of a comparative example in comparison to the semiconductor laser device containing a laser driver according to the first embodiment of the invention.

It is noted that FIG. 10 shows a comparative example in comparison to the first embodiment. In this comparative example, the semiconductor laser element 1, the signal detection part 3 and the laser driver 2 are disposed so as to be arrayed in one direction and in this order. It is noted that the laser driver 2 is mounted on a surface 62a of a mount portion 62 provided independently of the mount portion 60 serving for the semiconductor laser element 1 and the signal detection part 3. In the case where the signal detection part 3 and the laser driver 2 are disposed on one same side with respect to the semiconductor laser element 1 as in this comparative example (the right side in FIG. 10), there would arises a disadvantage that heat generation of the laser driver 2 has large influences on the characteristics of the signal detection part 3 or the like.

Figure 2A:
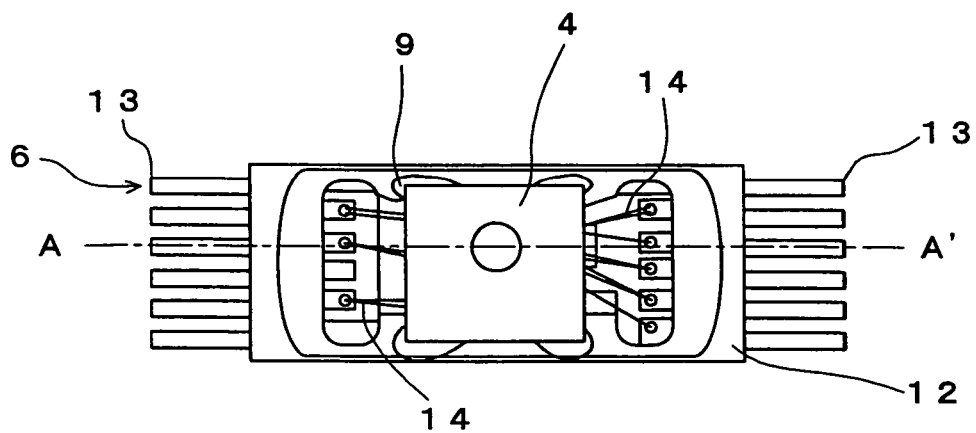
FIGS. 2A and 2B are a plan view and a sectional view, respectively, showing the construction of a semiconductor laser device containing a laser driver according to a second embodiment of the invention.
Figure 2B:
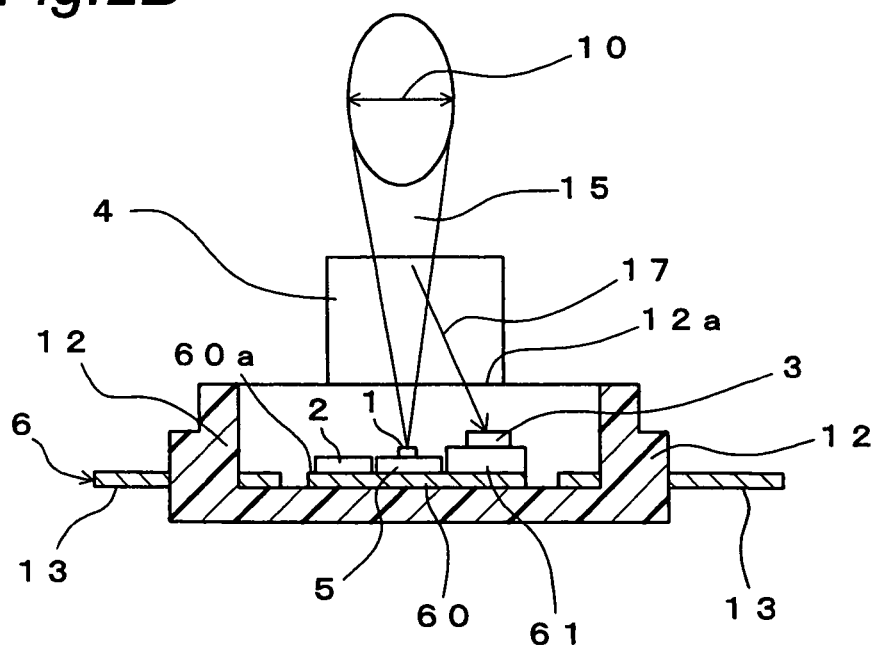

FIG. 2A shows a semiconductor laser device containing a laser driver according to a second embodiment as viewed from above, and FIG. 2B schematically shows an A–A' cross section in FIG. 2A. It is noted that the same constituent members as those in FIGS. 1A and 1B are designated by like reference numerals and their overlapped description is omitted (applicable also hereinafter).

In this semiconductor laser device containing a laser driver, the laser driver 2 and the signal detection part 3 are disposed on both sides with respect to the optical axis of the semiconductor laser element 1 (i.e., at both-side positions of an optical axis on a plane containing the optical axis) and moreover in such a direction that the laser light 15 emitted by the semiconductor laser element 1 results in a narrower breadth 10. In this example, the laser driver 2, the semiconductor laser element 1 and the signal detection part 3 are disposed so as to be arrayed in this order along the A–A' direction as in the first embodiment. The other constituent members are similar in construction to those of the first embodiment.

In this semiconductor laser device containing a laser driver, the laser driver 2 and the signal detection part 3 are placed on both sides with respect to the optical axis of the semiconductor laser element 1 (i.e., at both-side positions of an optical axis on a plane containing the optical axis) on the mount surface 60a, as in the first embodiment. That is, the laser driver 2 and the signal detection part 3 are placed farthest on the mount surface 60a. Consequently, influences of heat generation of the laser driver 2 exerted on the signal detection part 3 can be reduced to the least. Also, in this semiconductor laser device containing a laser driver, since the laser driver 2 and the signal detection part 3 are disposed in such a direction relative to the semiconductor laser element 1 that the laser light 15 emitted by the semiconductor laser element 1 results in a narrower breadth 10, the laser light 15 of the semiconductor laser element 1 less influences the signal detection part 3 and the laser driver 2. As a result of this, the signal detection part 3 is less subject to influences of stray light or the like. Further, bare chips may be used as the laser driver 2.

Figure 3A:
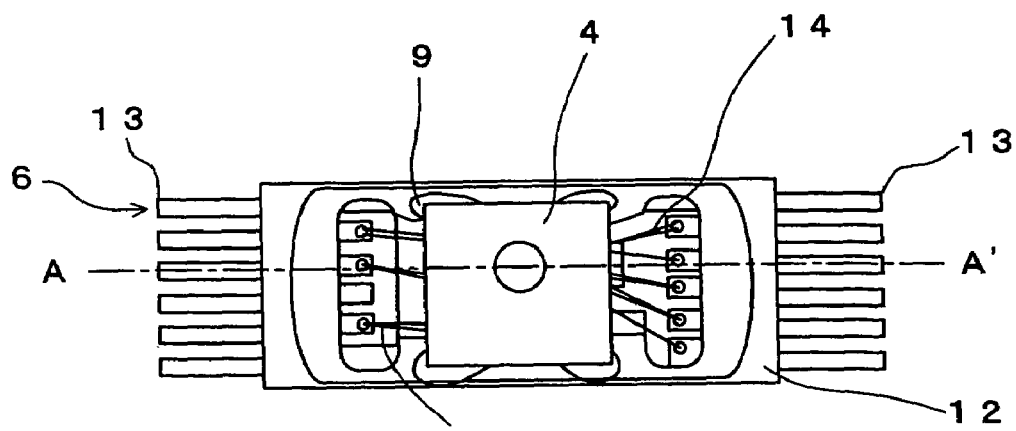
FIGS. 3A and 3B are a plan view and a sectional view, respectively, showing the construction of a semiconductor laser device containing a laser driver according to a third embodiment of the invention.
Figure 3B:
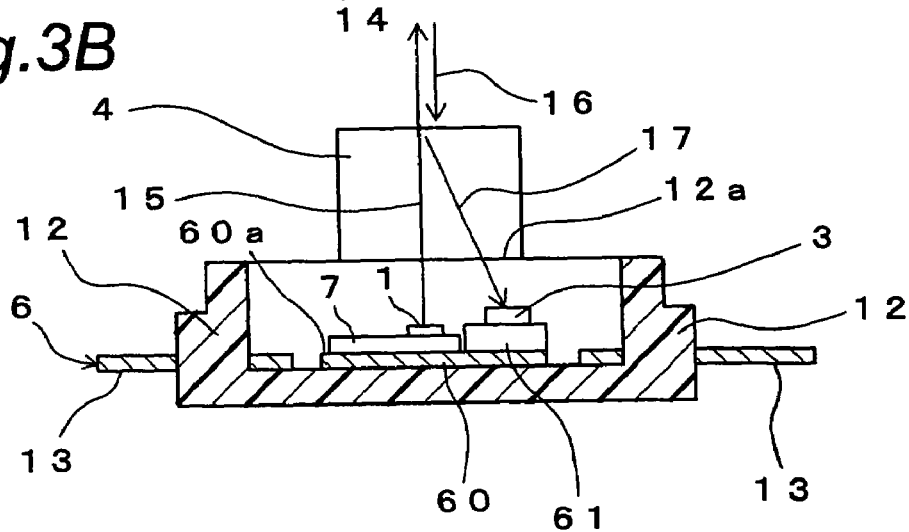

FIG. 3A shows a semiconductor laser device containing a laser driver according to a third embodiment as viewed from above, and FIG. 3B schematically shows an A–A' cross section in FIG. 3A.

In this semiconductor laser device containing a laser driver, a monitor detection part for monitoring an optical output of the semiconductor laser element 1, and a laser driver for driving the semiconductor laser element 1 based on an output of this monitor detection part, are integrated as a submount member 7 having a planar outer configuration. Then, this submount member 7 is disposed between the semiconductor laser element 1 and the mount surface 60*a* so as to be vertical to the optical axis of the semiconductor laser element 1. The other constituent members are similar in construction to those of the first embodiment.

In this semiconductor laser device containing a laser driver, since the semiconductor laser element 1, the submount member 7 including the monitor detection part and the laser driver, and the signal detection part 3 for performing photoelectric conversion are mounted on the common mount surface 60*a* of the lead frame 6 and accommodated in the common resin package 12, it becomes possible to implement further downsizing, thinning and cost reduction of equipment using the laser device. Still, the monitor detection part and the laser driver are integrated together as the submount member 7. Therefore, the laser driver 2 and the monitor detection part are treated as one component part, allowing the parts count to be substantially reduced. Further, since this submount member 7 is disposed vertical to the optical axis of the laser element 1, the submount member 7 can be die-bonded onto the mount surface 60*a* simultaneously and together with the laser element 1 during the manufacturing assembly, thus allowing the working man-hours to be reduced. As a result of this, it becomes possible to implement further downsizing, thinning and cost reduction of this semiconductor laser device containing a laser driver, and therefore to implement further downsizing, thinning and cost reduction of equipment using the laser device as well.

In addition, in this semiconductor laser device containing a laser driver, the operation of extracting a signal is performed in the same manner as in the first embodiment. In addition to this, since the laser driver drives the laser element 1 based on the output of the monitor detection part, the optical output of the semiconductor laser element 1 can be controlled stably.

Figure 4A:
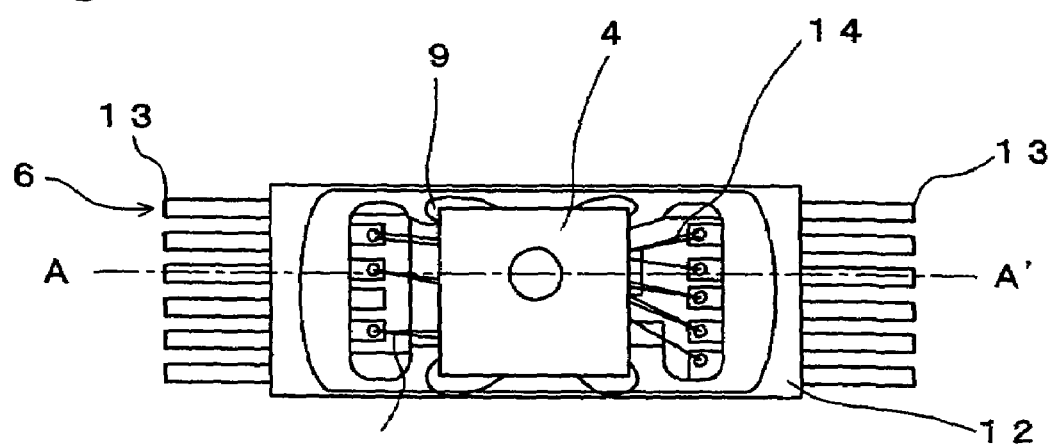
FIGS. 4A and 4B are a plan view and a sectional view, respectively, showing the construction of a semiconductor laser device containing a laser driver according to a fourth embodiment of the invention.
Figure 4B:
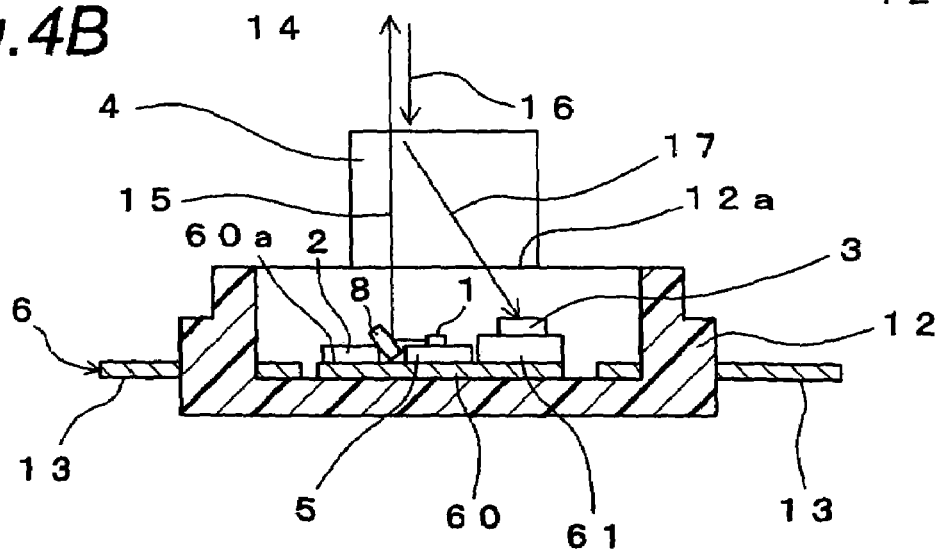

FIG. 4A shows a semiconductor laser device containing a laser driver according to a fourth embodiment as viewed from above, and FIG. 4B schematically shows an A–A' cross section in FIG. 4A.

In this semiconductor laser device containing a laser driver, the semiconductor laser element 1 is disposed so as to emit the laser light 15 parallel to the mount surface 60*a*. Besides, on the mount surface 60*a* is mounted a mirror 8 for reflecting the laser light 15 toward the hologram element 4 to make the laser light 15 raised vertically to the mount surface 60*a*. The other constituent members are similar in construction to those of the first embodiment.

In this semiconductor laser device containing a laser driver, the semiconductor laser element 1 is placed so as to emit laser light parallel to the mount surface 60*a*, and the mirror 8 for reflecting this laser light toward the hologram element 4 vertically to the mount surface 60*a* is mounted on the mount surface 60*a*. As a result of this, it becomes easier to achieve the bonding of individual component parts in their mounting onto the mount surface 60*a*, thus making it easier to achieve the manufacturing assembly. Thus, a productivity improvement can be achieved.

Figure 5A:
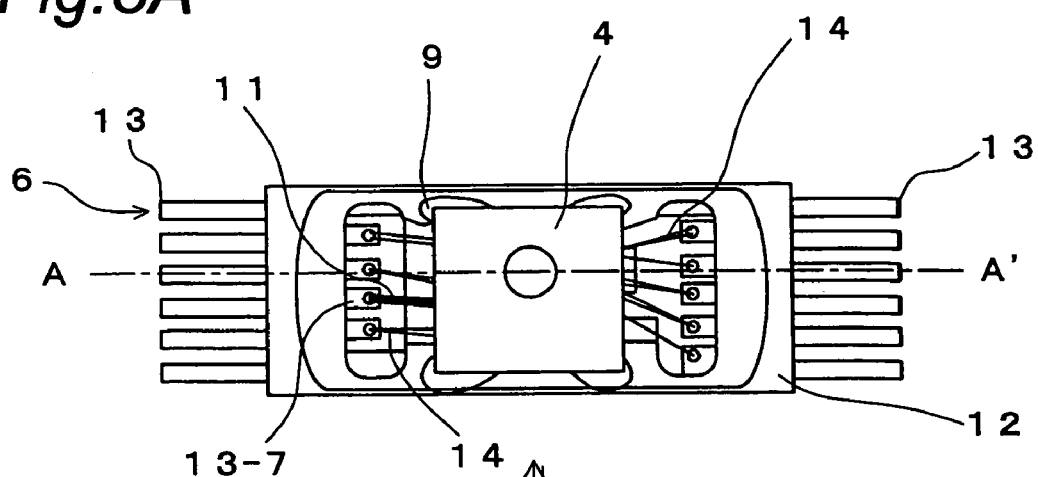
FIGS. 5A and 5B are a plan view and a sectional view, respectively, showing the construction of a semiconductor laser device containing a laser driver according to a fifth embodiment of the invention.
Figure 5B:
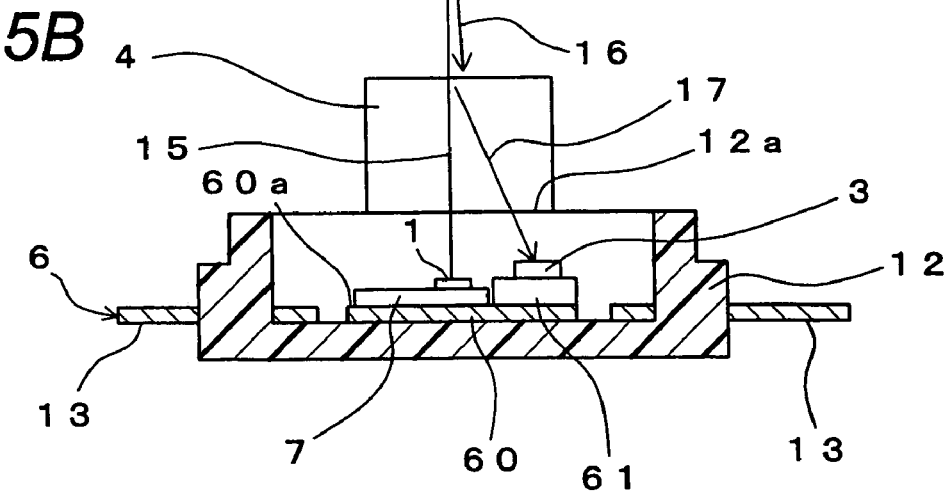

FIG. 5A shows a semiconductor laser device containing a laser driver according to a fifth embodiment as viewed from above, and FIG. 5B schematically shows an A–A' cross section in FIG. 5A.

In this semiconductor laser device containing a laser driver, a monitor detection part for monitoring an optical output of the semiconductor laser element 1, and a laser driver for driving the laser element 1 based on an output of this monitor detection part, are integrated as a submount member 7 having a planar outer configuration, as in the third embodiment (see FIGS. 3A and 3B). This submount member 7 is disposed between the laser element 1 and the mount surface 60*a* so as for the upper surface of the submount member 7 to be vertical to the optical axis of the semiconductor laser element 1. Besides, in this semiconductor laser device containing a laser driver, a lead pin 13 (its inner lead 13-7) for use of heat radiation is connected to the laser driver of the submount member 7 via metallic wires 11 thicker than normal thin metallic wires 14. The other constituent members are similar in construction to those of the first embodiment.

In this semiconductor laser device containing a laser driver, heat generated by the laser driver is radiated outside through the thick metallic wires 11 and the lead pin 13. Therefore, influences of heat generation of the laser driver exerted on the other component parts can be reduced. It is noted that the use of the thick metallic wires 11 makes it possible to enhance the heat radiation efficiency, as compared with the case where the normal thin metallic wires 14 are used.

Figure 6A:
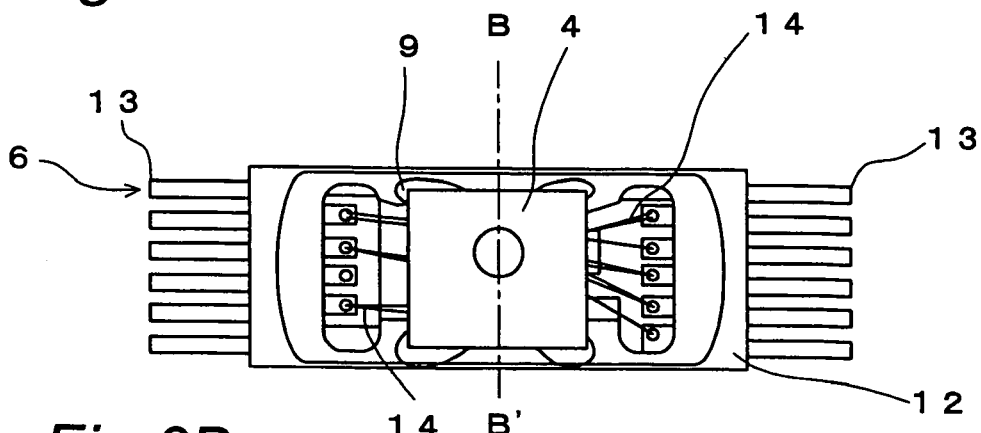
FIGS. 6A and 6B are a plan view and a sectional view, respectively, showing the construction of a semiconductor laser device containing a laser driver according to a sixth embodiment of the invention.
Figure 6B:
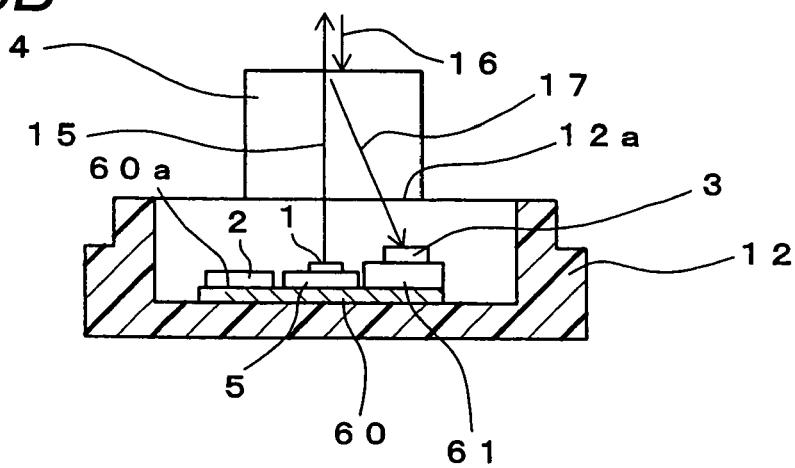

FIG. 6A shows a semiconductor laser device containing a laser driver according to a sixth embodiment as viewed from above, and FIG. 6B schematically shows an B–B' cross section in FIG. 6A. Further, FIG. 6C shows a state that the hologram element 4 in FIG. 6A has been removed so that the inside of the package 12 can be seen.

Figure 6C:
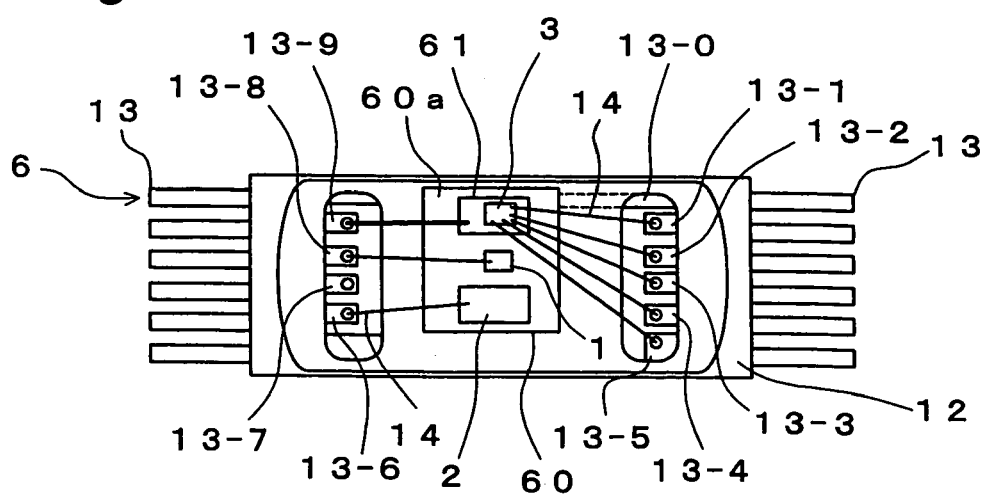
FIG. 6C is a plan view of the semiconductor laser device containing the laser driver in a state that the hologram element has been removed.

In this semiconductor laser device containing a laser driver, as can be better understood by FIG. 6C, the direction along which the laser driver 2, the semiconductor laser element 1 and the signal detection part 3 are arrayed and the direction along which the lead pins 13 extend are vertical to each other.

It is noted that the lead 13-0 extends from the mount portion 60, and is grounded in use. The leads 13-1, . . . , 13-5 are connected to the signal detection part 3, and used for extracting the signal to the outside. The lead 13-6 is connected to the laser driver 2, and used for driving the laser driver 2. The lead 13-8 is connected to the semiconductor laser element 1, and used for driving the laser element 1. The lead 13-9 is connected to an unshown monitor detection part, and used for extracting an output of the monitor detection part to the outside.

In this semiconductor laser device containing a laser driver, the direction along which the laser driver 2, the semiconductor laser element 1 and the signal detection part 3 are arrayed and the direction along which the lead pins 13 extend are vertical to each other. Therefore, this laser device containing a laser driver can be reduced in the size in the direction along which the lead pins 13 extend (i.e., in the longitudinal direction). Consequently, it becomes possible to forward the downsizing of equipment using the laser device.

Figure 7A:
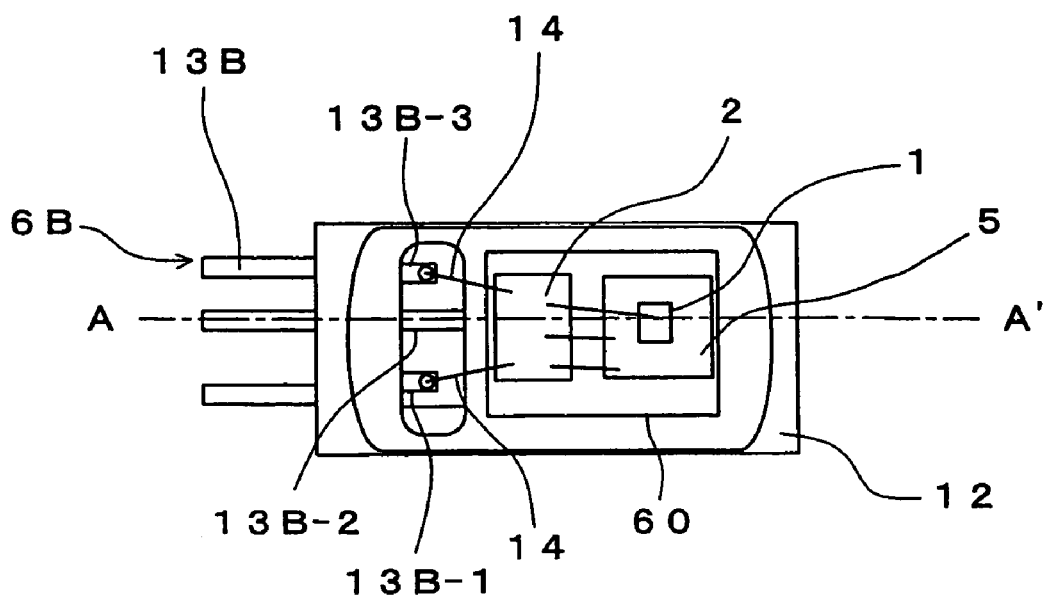
FIGS. 7A and 7B are a plan view and a sectional view, respectively, showing the construction of a semiconductor laser device containing a laser driver according to a seventh embodiment of the invention.
Figure 7B:
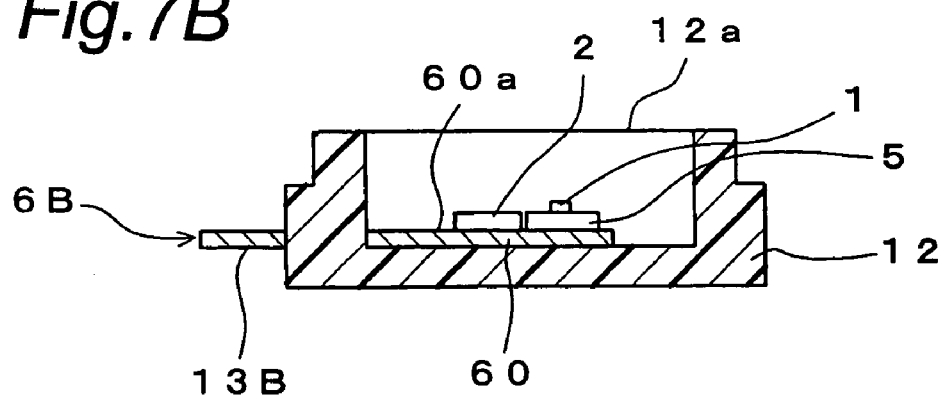

FIG. 7A shows a semiconductor laser device containing a laser driver according to a seventh embodiment, as viewed from above, and FIG. 7B schematically shows an A–A' cross section in FIG. 7A.

This semiconductor laser device containing a laser driver has a lead frame 6B, a resin package 12 integrally formed with a resin mold in such a manner that the mount portion 60 of the lead frame 6B is surrounded by the resin package 12. The package 12 has an opening at its upper portion 12*a*.

The lead frame 6B includes the mount portion (also referred to as island or die-pad) 60 having a flat, rectangular mount surface 60a, and lead pins 13B, 13B, . . . extending from vicinities of the mount portion 60 toward one side of the A–A' direction (rightward direction in FIGS. 7A and 7B) within a plane along the mount surface 60a. It is noted that reference numerals 13B-1, 13B-2 and 13B-3 denote inner lead portions present within the package 12 out of the lead pins 13B, 13B, 13B.

On the mount surface 60a are provided a semiconductor laser element 1, and a laser driver 2 for driving the semiconductor laser element 1. The semiconductor laser element 1 is mounted on the mount surface 60a via a planar submount 5, while the laser driver 2 is mounted directly on the mount surface 60a. In this example, the laser driver 2 and the laser element 1 are arrayed in this order along the A–A' direction. These component parts 1, 2 and 5 are accommodated in the common resin package 12 together with the mount portion 60.

In this semiconductor laser device containing a laser driver, since the semiconductor laser element 1 and the laser driver 2 are mounted on the common mount surface 60a of the lead frame 6B and moreover accommodated in the common resin package 12, it becomes possible to implement further downsizing, thinning and cost reduction of this semiconductor laser device containing a laser driver, and therefore moreover to implement further downsizing, thinning and cost reduction of equipment using the laser device.

It is noted that this semiconductor laser device containing a laser driver includes neither the signal detection part 3 nor the hologram element 4, unlike the already described individual embodiments. Those component parts are provided separately in the process of assembling the equipment using the laser device.

The aforementioned lead 13B-2 is connected to the mount portion 60, and is grounded in use. The leads 13B-1 and 13B-3 are connected to the laser driver 2, and used for driving the laser driver 2 to control the output of the laser element 1. Since the output-control leads 13B-1 and 13B-3 are connected to the laser driver 2 as shown above, the output of the semiconductor laser element 1 is controlled via the laser driver 2 according to a control signal, such as voltage level, applied from external to these output-control leads 13B-1 and 13B-3. Accordingly, the circuit of the laser driver 2 can be simplified, so that further cost reduction can be implemented.

Furthermore, it is desirable that, as in the already described fourth embodiment (see FIGS. 4A and 4B), the semiconductor laser element 1 is disposed so as to emit laser light parallel to the mount surface 60a, and that a mirror 8 for reflecting this laser light to raise the light vertical to the mount surface 60a is mounted on the mount surface 60a. In this case, it becomes easier to achieve the bonding of individual component parts in their mounting onto the mount surface 60a, thus making it easier to achieve the manufacturing assembly.

Figure 8A:
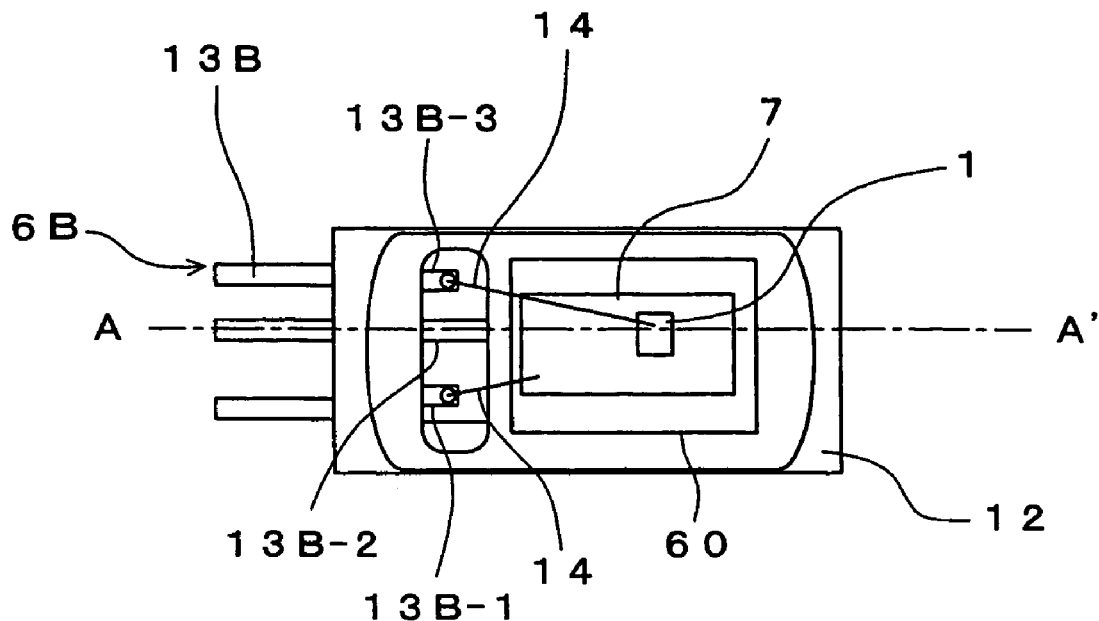
FIGS. 8A and 8B are a plan view and a sectional view, respectively, showing the construction of a semiconductor laser device containing a laser driver according to an eighth embodiment of the invention.
Figure 8B:
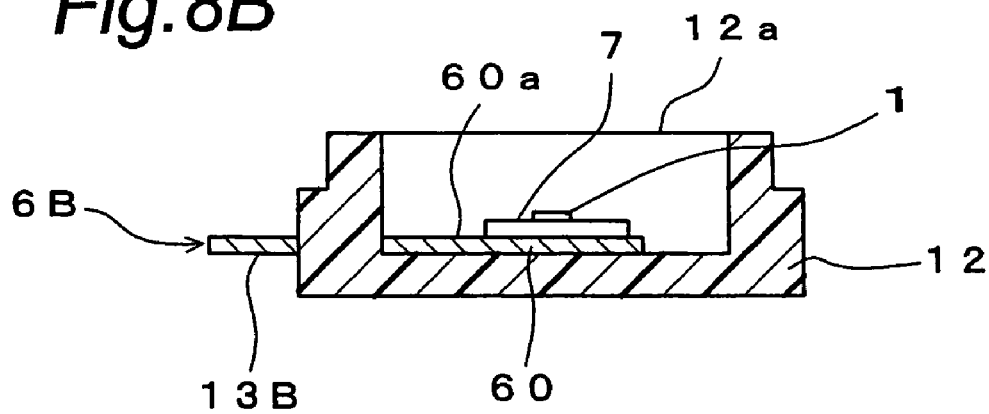
Figure 9A:
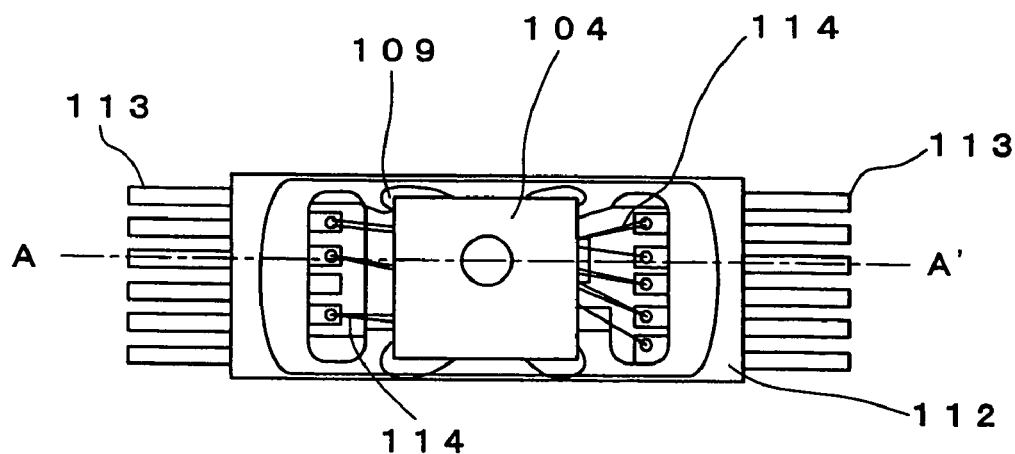
FIGS. 9A and 9B are a plan view and a sectional view, respectively, showing the construction of a conventional semiconductor laser device.
Figure 9B:
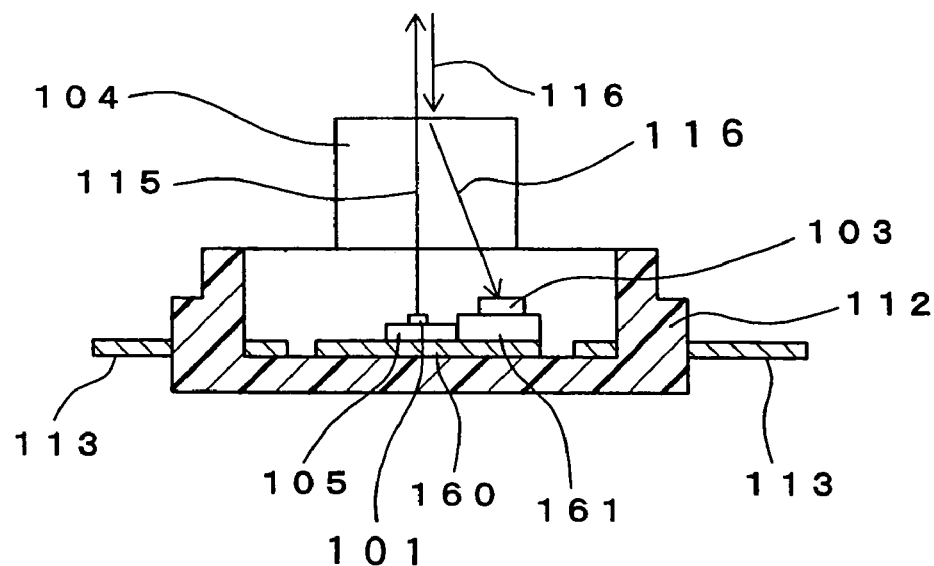

FIG. 8A shows a semiconductor laser device containing a laser driver according to an eighth embodiment as viewed from above, and FIG. 8B schematically shows an A–A' cross section in FIG. 8A.

In this semiconductor laser device containing a laser driver, as in the already described third embodiment (see FIGS. 3A and 3B), a monitor detection part for monitoring an optical output of the semiconductor laser element 1, and a laser driver for driving the laser element 1 based on an output of this monitor detection part, are integrated as a submount member 7 having a planar outer configuration.

Then, this submount member 7 is disposed between the laser element 1 and the mount surface 60a so as for the upper surface of the submount member 7 to be vertical to the optical axis of the semiconductor laser element 1. The other constituent members are similar in construction to those of the seventh embodiment.

In this semiconductor laser device containing a laser driver, since the semiconductor laser element 1 and the submount member 7 including the monitor detection part and the laser driver are mounted on the common mount surface 60a of the lead frame 6 and moreover accommodated in the common resin package 12, it becomes possible to implement further downsizing, thinning and cost reduction of equipment using the laser device. Still, the monitor detection part and the laser driver are integrated together as the submount member 7. Therefore, the laser driver 2 and the monitor detection part are treated as one component part, allowing the parts count to be substantially reduced. Further, since this submount member 7 is disposed vertical to the optical axis of the semiconductor laser element 1, the submount member 7 can be die-bonded onto the mount surface 60a simultaneously and together with the laser element 1 during the manufacturing assembly, thus allowing the working man-hours to be reduced. As a result of this, it becomes possible to implement further downsizing, thinning and cost reduction of this semiconductor laser device containing a laser driver, and therefore to implement further downsizing, thinning and cost reduction of equipment using the laser device as well.

Furthermore, although not shown, it is desirable that the laser driver integrated with the submount member 7 is disposed along the optical-axis direction of the monitor detection part. In this case, there is no need for disposing component parts along a direction vertical to the optical-axis direction of the monitor detection part, so that the size in the direction vertical to the optical-axis direction of the monitor detection part is reduced. Accordingly, it becomes possible to implement further thinning of this semiconductor laser device containing a laser driver and therefore further thinning of equipment using the laser device as well.

Figure 11:
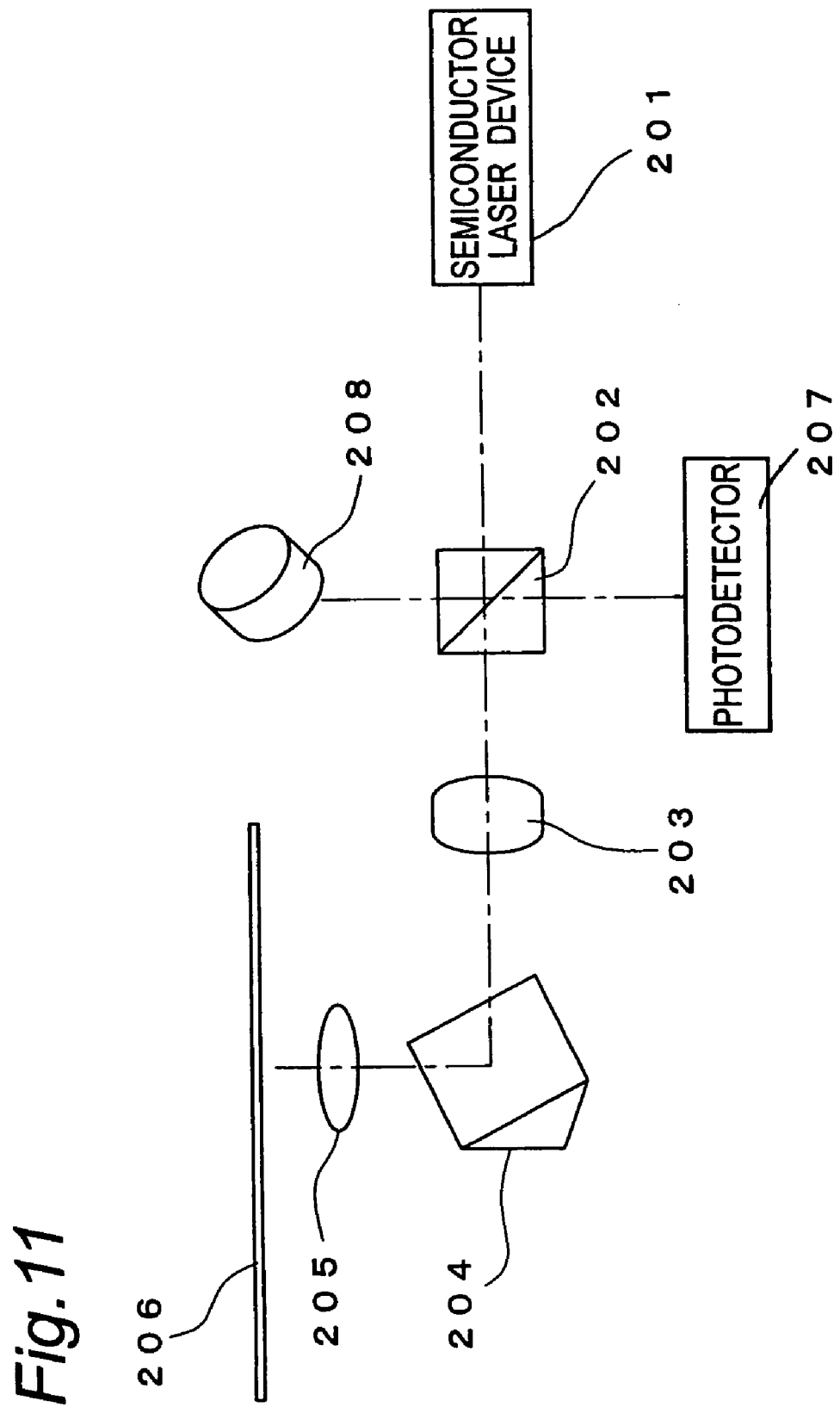
FIG. 11 is a view showing the construction of an optical system of an optical pickup equipped with the semiconductor laser device containing a laser driver according to the invention.

FIG. 11 illustrates the construction of an optical system of an optical pickup as equipment using the laser device.

This optical pickup has a semiconductor laser device 201 containing a laser driver corresponding to the foregoing seventh embodiment (see FIGS. 7A and 7B), a beam splitter 202, a collimator lens 203, a mirror 204, an objective lens 205, a photodetector 207 as a signal detection part, and an APC (Automatic Power Control) use detector 208 as a monitor detection part.

This optical pickup is used to read information recorded on an optical disc 206 as a recording medium, such as CD (Compact Disc), CD-ROM (Compact Disc Read Only Memory), MD (Mini Disc) or DVD (Digital Versatile Disc), or to write information thereinto. In the optical disc 206, various types of information have been recorded by fine dips and bumps, differences in reflectivity, direction of magnetization or the like.

Laser light emitted from the semiconductor laser element 201 containing a laser driver travels via the beam splitter 202, the collimator lens 203 and the mirror 204, being converged onto the recording surface of the optical disc 206 through the objective lens 205. The light (signal light) reflected by the recording surface of the optical disc 206 travels again via the objective lens 205, the mirror 204 and the collimator lens 203, being incident on the beam splitter 202. The laser light incident on the beam splitter 202 is branched by this beam splitter 202, and the resulting beams come incident on the photodetector 207 and the APC-use detector 208, respectively. The beam coming into the photodetector 207 is converted into an electric signal, and then a signal representing recording information, a focus error signal (FES) and a radial error signal (RES) are generated by an unshown known arithmetic processing circuit. For example, the Foucault method and the three-beam method are used for FES detection and RES detection, respectively. The light coming into the APC-use detector 208 is converted into an electric signal and used for controlling the output of the laser element 1 via the laser driver 2.

In this example of the optical pickup, the APC-use detector 208 is provided. However, in the case where the optical disc is a CD, which is not required to have so high precision as compared with other recording mediums, it is permitted to omit the APC-use detector 208.

Since this optical pickup is equipped with the semiconductor laser device 201 containing a laser driver to which the present invention is applied, it becomes possible to implement downsizing, thinning and cost reduction, as already explained. Moreover, as the semiconductor laser device 201 containing a laser driver, for example, one corresponding to the foregoing third embodiment (see FIGS. 3A and 3B), when used instead of the one corresponding to the foregoing seventh embodiment (see FIGS. 7A and 7B), makes it possible to incorporate the signal detection part and the monitor detection part integrally into the package of the laser device, which allows the downsizing, thinning and cost reduction to be further implemented.

As apparent from the above description, according to the semiconductor laser device containing a laser driver of the present invention, it becomes possible to implement further downsizing, thinning and cost reduction of equipment using the laser device.

Further, since the electronic equipment according to the present invention is provided with such a semiconductor laser device containing a laser driver, its downsizing, thinning and cost reduction can be further implemented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device containing a laser driver comprising,
    a semiconductor laser element;
    a laser driver for driving the semiconductor laser element;
    a lead frame having a common mount surface on which the semiconductor laser element and the laser driver are mounted;
    one common package for accommodating therein the semiconductor laser element and the laser driver;
    a signal detection part for performing photoelectric conversion; and
    a hologram element provided upward of the semiconductor laser element and serving for transmitting laser light emitted by the semiconductor laser element toward a recording medium and then diffracting toward the signal detection part the laser light reflected by the recording medium;
    wherein the signal detection part is mounted on the common mount surface of the lead frame and accommodated in the common package,
    wherein the laser driver and the signal detection part are disposed on different sides of an optical axis of the semiconductor laser element,
    wherein the laser driver, the semiconductor laser element and the signal detection part are arranged in a direction in which the lead frame extends,
    wherein laser light emitted by the semiconductor laser element has in a sectional shape thereof a first breadth in a first direction and a second breadth in a second direction roughly orthogonal to the first direction in which the first breadth is narrower than the second breadth, and
    wherein the laser element and the signal detection part are arranged roughly along the first direction.

2. The semiconductor laser device containing a laser driver according to claim 1, wherein the laser driver and the monitor detection part are integrated as a submount member having a planar outer configuration, and the submount member is disposed vertical to an optical axis of the semiconductor laser element.

3. The semiconductor laser device containing a laser driver according to claim 1, wherein the semiconductor laser element is disposed so as to emit laser light parallel to the common mount surface, and a mirror for reflecting the emitted laser light so as to raise the laser light vertical to the common mount surface is mounted on the common mount surface.

4. The semiconductor laser device containing a laser driver according to claim 2, wherein a heat-radiating lead is connected to the laser driver.

5. The semiconductor laser device containing a laser driver according to claim 1, further comprising:
    lead pins extending in one direction within a plane along the common mount surface,
    wherein a direction along which the laser driver, the semiconductor laser element and the signal detection part are arrayed and a direction along which the lead pins extend are coincident with each other.

6. The semiconductor laser device containing a laser driver according to claim 1, further comprising:
    lead pins extending in one direction within a plane along the common mount surface,
    wherein a direction along which the laser driver, the semiconductor laser element and the signal detection part are arrayed and a direction along which the lead pins extend are vertical to each other.

7. The semiconductor laser device containing a laser driver according to claim 1, further comprising
    a monitor detection part for monitoring an optical output of the semiconductor laser element, wherein
    the laser driver drives the semiconductor laser element based on an output of the monitor detection part,
    the monitor detection part is mounted on the common mount surface of the lead frame and moreover accommodated in the common package, and wherein
    the laser driver and the monitor detection part are integrated as a submount member having a planar outer configuration.

8. The semiconductor laser device containing a laser driver according to claim 7, wherein the laser driver integrated into the submount member is disposed along an optical-axis direction of the monitor detection part.

9. The semiconductor laser device containing a laser driver according to claim 1, wherein an output-control use lead is connected to the laser driver.

10. The semiconductor laser device containing a laser driver according to claim 1, wherein the semiconductor laser element is disposed so as to emit laser light parallel to the common mount surface, and a mirror for reflecting the emitted laser light so as to raise the laser light vertical to the common mount surface is mounted on the common mount surface.

11. Electronic equipment having the laser device as defined in claim 1.

12. A semiconductor laser device containing a laser driver, comprising:
- a semiconductor laser element;
- a laser driver for driving the semiconductor laser element;
- a signal detection part for performing photoelectric conversion;
- a lead frame having a common mount surface on which the laser driver, the semiconductor laser element and the signal detection part are mounted; and
- one common package for accommodating therein the semiconductor laser element, the laser driver and the signal detection part, wherein laser light emitted by the semiconductor laser element has in a sectional shape thereof a first breadth in a first direction and a second breadth in a second direction, the second direction is roughly orthogonal to the first direction, and the first breadth is narrower than the second breadth, and wherein the laser driver and the signal detection part are arranged roughly along the first direction.

\* \* \* \* \*